(12) United States Patent
Hwang et al.

(10) Patent No.: US 9,269,901 B2
(45) Date of Patent: Feb. 23, 2016

(54) RESISTANCE CHANGE MEMORY DEVICE HAVING THRESHOLD SWITCHING AND MEMORY SWITCHING CHARACTERISTICS, METHOD OF FABRICATING THE SAME, AND RESISTANCE CHANGE MEMORY DEVICE INCLUDING THE SAME

(71) Applicants: Hyunsang Hwang, Gwangju (KR);
Seonghyun Kim, Gwangju (KR);
Xinjun Liu, Gwangju (KR)

(72) Inventors: Hyunsang Hwang, Gwangju (KR);
Seonghyun Kim, Gwangju (KR);
Xinjun Liu, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 86 days.

(21) Appl. No.: 13/864,548

(22) Filed: Apr. 17, 2013

(65) Prior Publication Data
US 2013/0270509 A1 Oct. 17, 2013

(30) Foreign Application Priority Data
Apr. 17, 2012 (KR) .................. 10-2012-0039566

(51) Int. Cl.
*H01L 45/00* (2006.01)
*H01L 27/24* (2006.01)

(52) U.S. Cl.
CPC .......... *H01L 45/145* (2013.01); *H01L 27/2463* (2013.01); *H01L 45/08* (2013.01); *H01L 45/1233* (2013.01); *H01L 45/146* (2013.01); *H01L 45/1608* (2013.01); *H01L 45/1625* (2013.01); *H01L 45/1641* (2013.01)

(58) Field of Classification Search
CPC ..... H01L 45/04; H01L 45/08; H01L 45/1233; H01L 45/146; H01L 45/1608; H01L 45/1633
USPC .......................... 257/2–5, E45.001–E45.003
See application file for complete search history.

(56) References Cited

U.S. PATENT DOCUMENTS

| | | | | |
|---|---|---|---|---|
| 7,400,027 B2* | 7/2008 | Joung | ............... | G11C 13/0004 257/350 |
| 7,629,198 B2* | 12/2009 | Kumar | ................. | H01L 45/145 257/4 |
| 7,935,952 B2* | 5/2011 | Lee | .......................... | H01L 27/24 257/4 |
| 8,466,461 B2* | 6/2013 | Seo | ..................... | H01L 27/2436 257/3 |
| 8,569,104 B2* | 10/2013 | Pham | .................. | H01L 45/1253 257/2 |
| 9,117,513 B2* | 8/2015 | Hwang | ............. | G11C 13/0002 1/1 |
| 2013/0021835 A1* | 1/2013 | Hwang | ............. | G11C 13/0002 365/148 |

OTHER PUBLICATIONS

Xinjun Liu, et al, "Diode-less bilayer oxide (WOx-NbOx) device for cross-point resistive memory applications," Nanotechnology, 2011, 22, 475702 (7pp), 2011 IOP Publishing Ltd.*
Electronic supplementary information for "Diode-less bilayer oxide (WOx-NbOx) device for corss-point resistive memory applications", Nanotechnology, 2011, 22, 475702 (7pp) 2011 IOP Publishing Ltd.*

* cited by examiner

*Primary Examiner* — Allison P Bernstein
(74) *Attorney, Agent, or Firm* — Nath, Goldberg & Meyer; Joshua B. Goldberg; Stanley N. Protigal

(57) ABSTRACT

Disclosed are a resistance change memory device, a method of fabricating the same, and a resistance change memory array including the same. The resistance change memory device includes a first electrode and a second electrode. A hybrid switching layer is interposed between the first electrode and the second electrode. The hybrid switching layer is a metal oxide layer having both threshold switching characteristics and memory switching characteristics.

20 Claims, 16 Drawing Sheets

P6 : LRS/on

P7 : HRS/on

P8 : HRS/off

● : Vwrite(+) or Vwrite(-) biasing
(Selected cell)

● : $V_{read}$ biasing (Selected cell)

■ : ½ $V_{read}$ biasing (Unselected cell)

RESISTANCE CHANGE MEMORY DEVICE HAVING THRESHOLD SWITCHING AND MEMORY SWITCHING CHARACTERISTICS, METHOD OF FABRICATING THE SAME, AND RESISTANCE CHANGE MEMORY DEVICE INCLUDING THE SAME

CROSS-REFERENCE TO RELATED APPLICATION

This application claims priority to Korean Patent Application No. 10-2012-0039566 filed on 17 Apr. 2012 and all the benefits accruing therefrom under 35 U.S.C. §119, the contents of which are incorporated by reference in their entirety.

BACKGROUND

1. Technical Field

The present invention relates to semiconductor devices, and more particularly, to resistance change memory devices.

2. Description of the Related Art

Currently, a flash memory device commercialized as a resistance change memory device is based on change in threshold voltage resulting from storage or removal of charges from a charge storage layer. The charge storage layer may be a floating gate formed of a polysilicon layer or a charge trap layer formed of a silicon nitride layer. Recently, studies have been made to develop next generation resistance change memory devices which have lower power consumption and a higher degree of integration than the flash memory device. Examples of the next generation resistance change memory devices include a phase change random access memory (PRAM), a magnetic RAM (MRAM), and a resistive random access memory (ReRAM).

In order to realize a resistance change memory array using resistance change memory devices, a resistance change device acting as a memory device and a selection device connected to the resistance change device are generally used. The selection device may be a transistor or a diode. However, the transistor has a limit in size reduction due to a short channel effect such as punch through. In addition, since the diode allows only unidirectional electric current, the diode is not suitable for a bipolar device which exhibits resistance change characteristics at both polarities as in the resistance change device.

Further, such a selection device is formed through many additional processes. For example, the transistor is fabricated by forming a gate electrode, source/drain regions, and source/drain electrodes. Further, the diode is fabricated by forming an n-type semiconductor and a p-type semiconductor, and an electrode for connection with the resistance change device.

BRIEF SUMMARY

An aspect of the present invention is to provide a resistance change memory device and a resistance change memory array, which include selection device characteristics and can be fabricated in a high degree of integration without substantially increasing process steps.

In accordance with one aspect of the present invention, there is provided a resistance change memory device. The resistance change memory device includes a first electrode and a second electrode. A hybrid switching layer is disposed between the first electrode and the second electrode. The hybrid switching layer is a metal oxide layer which has both threshold switching characteristics and memory switching characteristics.

The hybrid switching layer may be represented by $FeO_x$ (1≤x≤2), $VO_x$ (1≤X≤2.5), $TiO_x$ (1≤X≤2), or $NbO_x$ (1≤X≤2.5). The hybrid switching layer may include a threshold switching layer disposed on the first electrode and a memory switching layer disposed on the threshold switching layer. The threshold switching layer has threshold switching characteristics and the memory switching layer has memory switching characteristics. The memory switching layer and the threshold switching layer may be formed of the same kind of metal oxide, and the memory switching layer may have a higher oxygen content than the threshold switching layer.

The threshold switching layer may exhibit metal-insulator transition characteristics. In some embodiments, the threshold switching layer may be represented by $FeO_x$ (1≤X≤1.5), $VO_x$ (1≤X≤2), $TiO_x$ (1≤X≤1.75), or $NbO_x$ (1≤X≤2). Specifically, the threshold switching layer may be represented by $NbO_x$ (1≤X≤2).

The second electrode may include a conductive oxide zone at least in a region thereof adjoining the hybrid switching layer.

In accordance with another aspect of the present invention, there is provided a method of fabricating a resistance change memory device. First, a first electrode is formed. Then, a metal-rich non-stoichiometric metal oxide layer is formed on the first electrode. The metal oxide layer is subjected to surface treatment with oxygen to form a hybrid switching layer which is a metal oxide layer having both threshold switching characteristics and memory switching characteristics. A second electrode is formed on the hybrid switching layer.

The metal-rich non-stoichiometric metal oxide layer may exhibit metal-insulator transition characteristics. In some embodiments, the metal-rich non-stoichiometric metal oxide layer may be represented by $FeO_x$ (1≤X≤1.5), $VO_x$ (1≤X≤2), $TiO_x$ (1≤X≤1.75), or $NbO_x$ (1≤X≤2).

The hybrid switching layer may include a threshold switching layer disposed on the first electrode and having threshold switching characteristics and a memory switching layer disposed on the threshold switching layer and having memory switching characteristics. The memory switching layer and the threshold switching layer may be formed of the same kind of metal oxide, and the memory switching layer may have a higher oxygen ratio than the threshold switching layer.

The second electrode may contain a metal exhibiting the same or higher reactivity than a metal contained in the hybrid switching layer, at least in a region thereof adjoining the hybrid switching layer.

In accordance with a further aspect of the present invention, there is provided a resistance change memory array. The resistance change memory array includes a plurality of first signal lines and a plurality of second signal lines crossing the first signal lines. A hybrid switching layer is disposed at each of crossing points between the first signal lines and the second signal lines. The hybrid switching layer may have both threshold switching characteristics and memory switching characteristics.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION

Figure 1A:
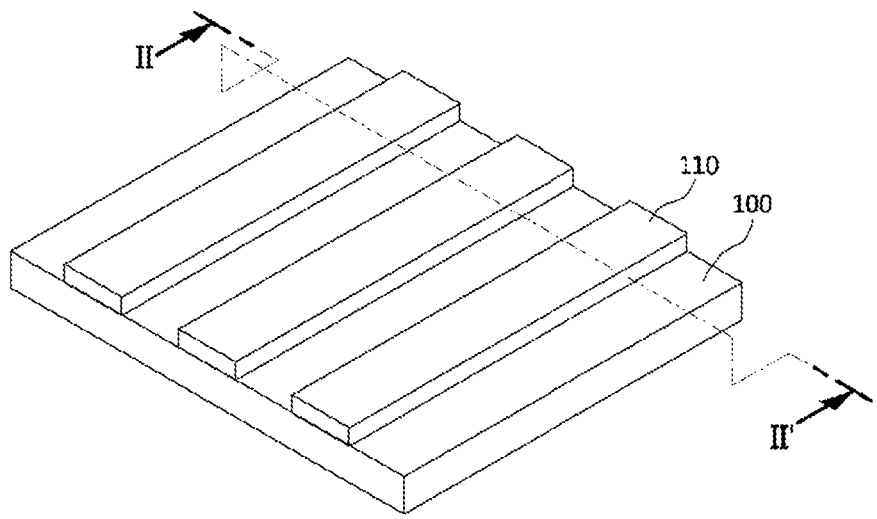
FIG. 1a to FIG. 1e are perspective views illustrating a method of fabricating a resistance change memory array in accordance with one embodiment of the present invention.

Exemplary embodiments of the present invention will now be described in detail with reference to the accompanying drawings. However, it should be understood that the present invention is not limited to the following embodiments and may be embodied in different ways by those skilled in the art without departing from the scope of the present invention. Further, it should be understood that various modifications and equivalent embodiments may be made by those skilled in the art without departing from the spirit and scope of the present invention.

It will be understood that when a layer is referred to as being "on" another layer or substrate, it can be directly formed on the other layer or substrate, or an intervening layer(s) may also be present. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations.

In the drawings, the thicknesses of layers and regions can be exaggerated or omitted for clarity. The same components will be denoted by the same reference numerals throughout the specification.

FIG. 1a to FIG. 1e are perspective views illustrating a method of fabricating a resistance change memory array in accordance with one embodiment of the present invention. FIG. 2a to FIG. 2e are sectional views taken along lines II-II' of FIG. 1a to FIG. 1e.

Figure 2A:
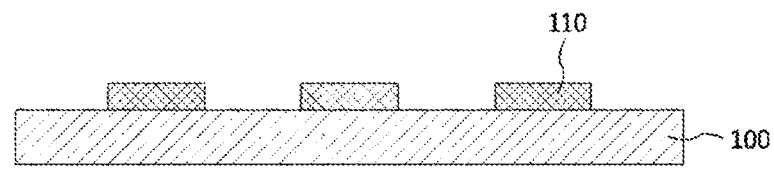
FIG. 2a to FIG. 2e are sectional views taken along lines II-II' of FIG. 1a to FIG. 1e.

Referring to FIG. 1a and FIG. 2a, a plurality of first signal lines 110 may be formed on a substrate 100 to be parallel to each other in a first direction. The first signal lines 110 may be formed of Pt, Ru, Au, TiN, or TaN.

Figure 1B:
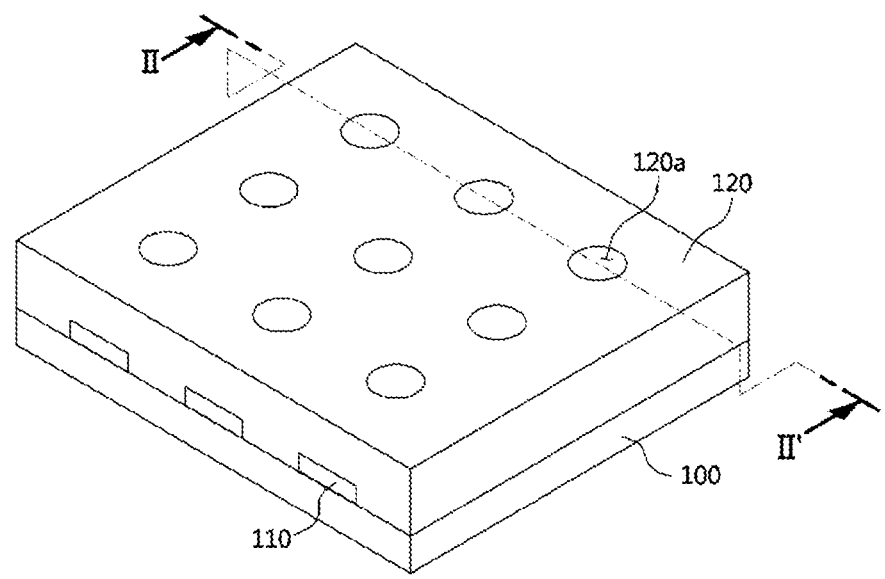
Figure 2B:
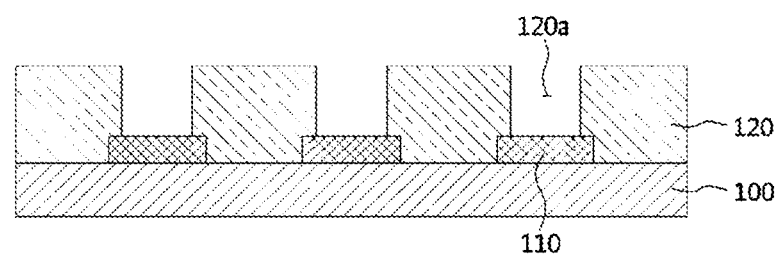

Referring to FIG. 1b and FIG. 2b, an insulation layer 120 may be formed on the first signal lines 110. Holes 120a may be formed in the insulation layer 120 to expose some regions of the first signal lines 110 therethrough. The holes 120a may define unit cell areas. The insulation layer 120 may be formed of a silicon oxide layer, silicon nitride layer, or silicon oxide nitride layer.

Figure 1C:
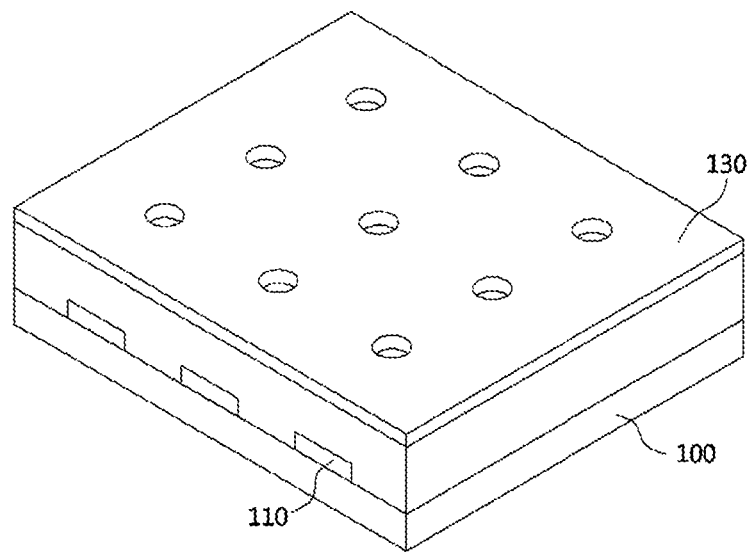
Figure 2C:
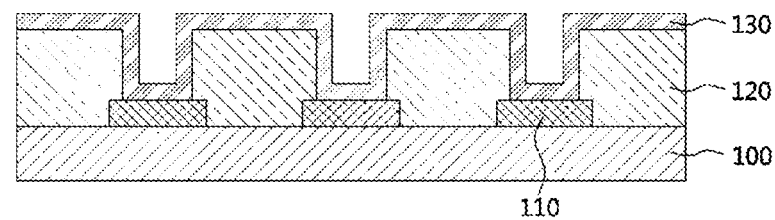

Referring to FIG. 1c and FIG. 2c, a metal oxide layer 130 may be formed on the insulation layer 120 having the holes 120a therein. The metal oxide layer 130 is a metal-rich non-stoichiometric layer and may exhibit threshold switching characteristics. In some embodiments, the metal oxide layer 130 may exhibit metal-insulator transition and may be formed of at least one selected from the group consisting of V, Ti, Nb, Fe and a combination thereof. The metal oxide layer 130 may be represented by $FeO_x$ ($1 \le X \le 1.5$, specifically $1 \le X \le 1.4$), $VO_x$ ($1 \le X \le 2$), $TiO_x$ ($1 \le X \le 1.75$, specifically $1 \le X \le 1.5$), or $NbO_x$ ($1 \le X \le 2$). In some embodiments, the metal oxide layer 130 may be represented by $NbO_x$ ($1 \le X \le 2$).

The metal oxide layer 130 may be formed by physical vapor deposition or chemical vapor deposition. In some embodiments, the metal oxide layer 130 may be formed by sputtering, for example, reactive sputtering.

Figure 1D:
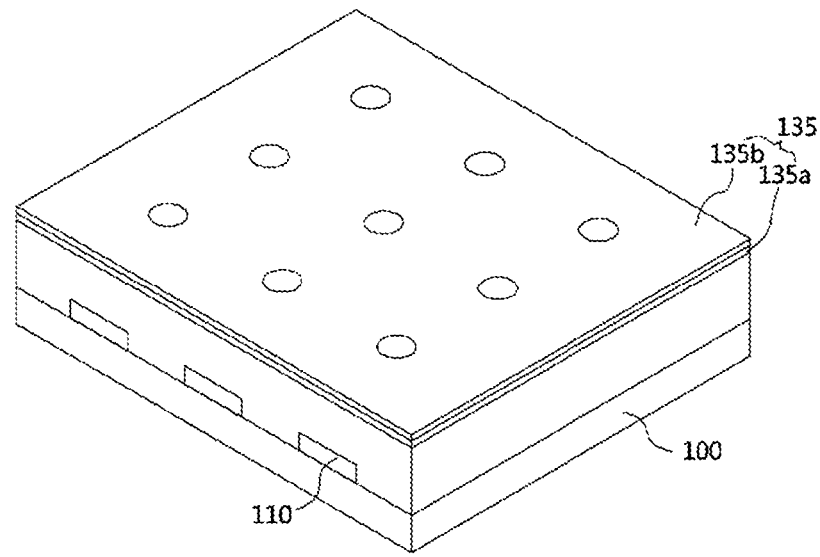
Figure 2D:
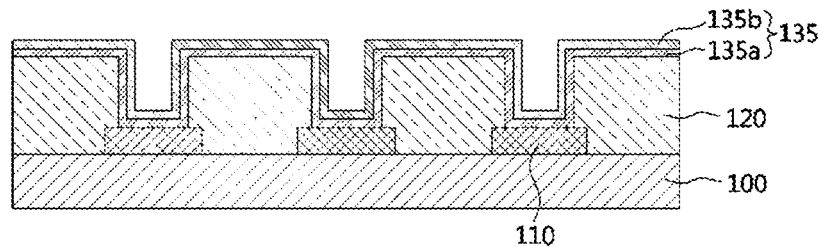

Referring to FIG. 1d and FIG. 2d, the metal oxide layer 130 is subjected to surface treatment with oxygen. Surface treatment of the metal oxide layer 130 with oxygen may be achieved by, for example, supplying oxygen gas onto the deposited metal oxide layer 130 within a deposition chamber in which the metal oxide layer 130 is deposited. In other embodiments, surface treatment of the metal oxide layer 130 with oxygen may be achieved by leaving the substrate having the metal oxide layer 130 formed thereon in air. As a result, a hybrid switching layer 135 having both threshold switching characteristics and memory switching characteristics may be formed. The hybrid switching layer 135 may be represented by $FeO_x$ ($1 \le X \le 2$), $VO_x$ ($1 \le X \le 2.5$), $TiO_x$ ($1 \le X \le 2$), or $NbO_x$ ($1 \le X \le 2.5$). The hybrid switching layer 135 may have a thickness of 5 nm to 50 nm.

Specifically, a lower region of the hybrid switching layer 135 may be a threshold switching layer 135a, which has threshold switching characteristics and has substantially the same composition as the metal oxide layer 130 described with reference to FIGS. 1c and 2c. In addition, an upper region of the hybrid switching layer 135 may be a memory switching layer 135b, which has memory switching characteristics and has an atomic ratio of metal to oxygen closer to a stoichiometric ratio than the threshold switching metal layer 135a by the surface treatment with oxygen. Further, the memory switching layer 135b is formed of the same kind of metal oxide as that of the threshold switching layer 135a, and has a higher oxygen ratio than the threshold switching layer 135a. The threshold switching layer 135a may have a thickness of 2 nm to 30 nm, and the memory switching layer 135b may have a thickness of 2 nm to 30 nm.

The threshold switching layer 135a may exhibit metal-insulator transition characteristics. At a certain temperature (threshold temperature) or voltage (threshold voltage) or more, the threshold switching layer 135a may undergo rapid reduction in electrical resistance by about $10^4$ to $10^5$ times and may transition from an insulator to a metal.

In some embodiments, the threshold switching layer 135a may be represented by $FeO_x$ ($1 \leq X \leq 1.5$, specifically $1 \leq X \leq 1.4$), $VO_x$ ($1 \leq X \leq 2$), $TiO_x$ ($1 \leq X \leq 1.75$, specifically $1 \leq X \leq 1.5$), or $NbO_x$ ($1 \leq X \leq 2$). Here, the memory switching layer 135b has a higher oxygen ratio than the threshold switching layer 135a within the composition ratio of the hybrid switching layer 135. In some embodiments, the memory switching layer 135b may be represented by $FeO_x$ ($1 \leq X \leq 2$, specifically $1.4 \leq X \leq 2$), $VO_x$ ($1 \leq X \leq 2.5$, specifically $2 \leq X \leq 2.5$), $TiO_x$ ($1 \leq X \leq 2$, specifically $1.75 \leq X \leq 2.5$), or $NbO_x$ ($1 \leq X \leq 2.5$, specifically $2 \leq X \leq 2.5$).

In some embodiment, the threshold switching layer 135a may be represented by $NbO_x$ ($1 \leq X \leq 2$), and the memory switching layer 135b has a higher oxygen ratio than the threshold switching layer 135a within the composition ratio of $NbO_x$ ($1 \leq X \leq 2.5$). In addition, the memory switching layer may be represented by $NbO_x$ ($2 \leq X \leq 2.5$).

Figure 1E:
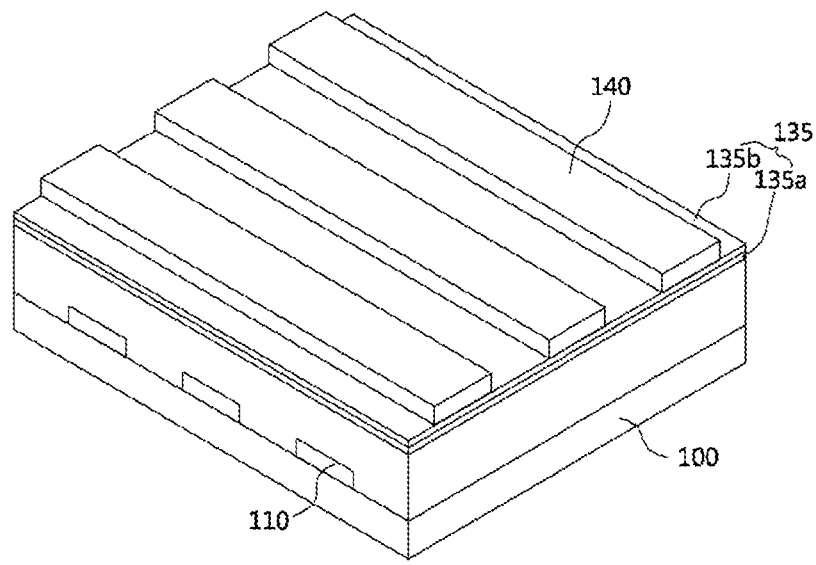
Figure 2E:
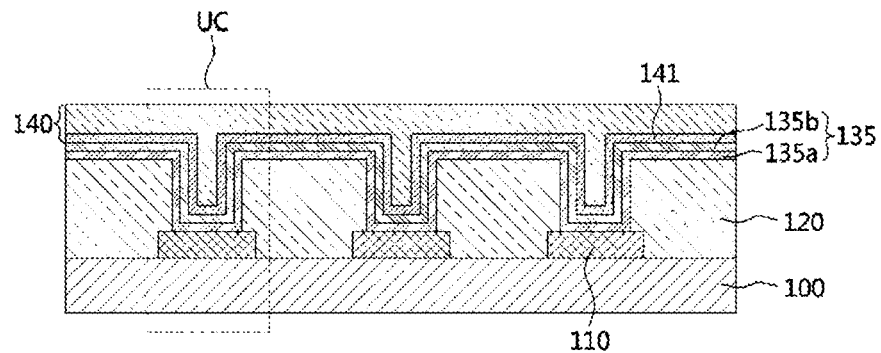

Referring to FIGS. 1e and 2e, a plurality of second signal lines 140 may be formed on the hybrid switching layer 135 to be parallel to each other while crossing the first signal lines 110.

The second signal lines 140 may contain a metal which exhibits the same or higher reactivity than the metal contained in the hybrid switching layer 135, at least in a region thereof adjoining the hybrid switching layer 135 (specifically, the memory switching layer 135b). More specifically, the second signal lines 140 may contain a metal, which has the same or lower Gibb's free energy for generation of oxides than the metal contained in the hybrid switching layer 135, at least in the region thereof adjoining the hybrid switching layer 135. As a result, oxygen in the hybrid switching layer 135, specifically, in the memory switching layer 135b, may be moved into the second signal lines 140, and the region of the hybrid switching layer 135 adjoining the memory switching layer 135b of the second signal lines 140 may be changed into a metal-rich conductive oxide region 141. Here, oxygen holes may be accumulated inside the memory switching layer 135b.

A unit cell (UC) may be defined at each of crossing points between the first signal lines 110 and the second signal lines 140. In the unit cell (UC), each of the first signal lines 110 may be referred to as the first electrode and each of the second signal lines 140 may be referred to as the second electrode.

FIG. 3a to FIG. 3h are sectional views of a resistance change unit memory cell in accordance with one embodiment of the present invention, illustrating current-voltage characteristics of the resistance change unit memory cell. FIG. 4 is a current-voltage curve of the resistance change unit memory cell in accordance with the embodiment of the present invention.

Figure 3A:
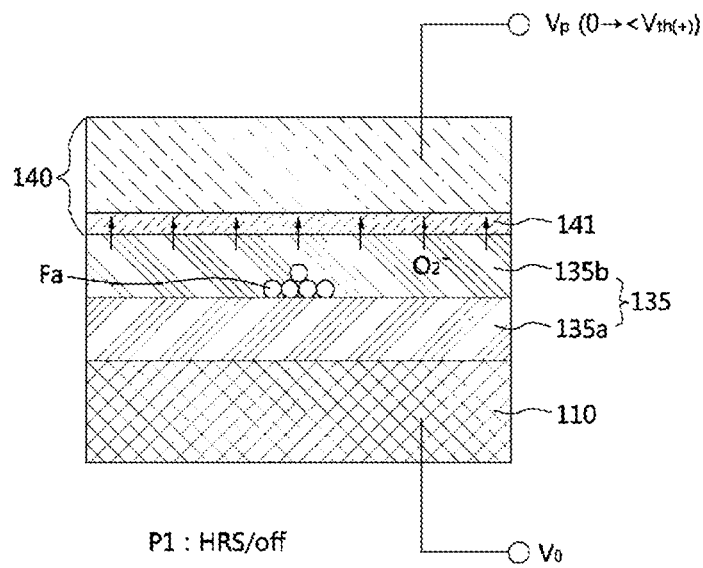
FIG. 3a to FIG. 3h are sectional views of a resistance change unit memory cell in accordance with one embodiment of the present invention, illustrating current-voltage characteristics of the resistance change unit memory cell.
Figure 4:
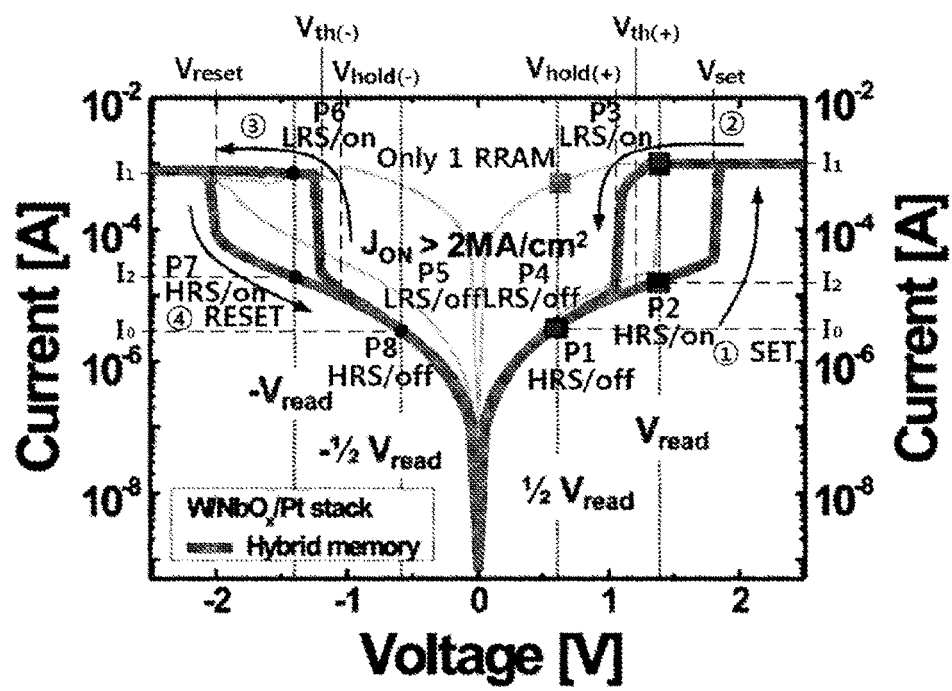
FIG. 4 is a current-voltage curve of the resistance change unit memory cell in accordance with the embodiment of the present invention.

Referring to FIG. 3a and FIG. 4, with a reference voltage, for example, a ground voltage $V_0$, applied to a first electrode 110, a positive sweep voltage Vp ranging from 0 V to less than a first threshold voltage $V_{th}(+)$ is applied to a second electrode 140 (P 1). Then, oxygen ions in a memory switching layer 135b are moved into the second electrode 140 by a positive electric field generated between the first and second electrodes 110, 140, and oxidize a lower region of the second electrode 140, thereby increasing the thickness of the conductive oxide region 141. At the same time, oxygen holes introduced into the memory switching layer 135b may grow an oxygen hole filament (Fa). However, the oxygen hole filament (Fa) does not grow to a height capable of contacting the second electrode 140. As a result, the memory switching layer 135b is maintained in a high resistance state (HRS). On the other hand, since an effective positive electric field is not applied to a threshold switching layer 135a, the threshold switching layer is maintained in an off state (P1 state: HRS/OFF).

Figure 3B:
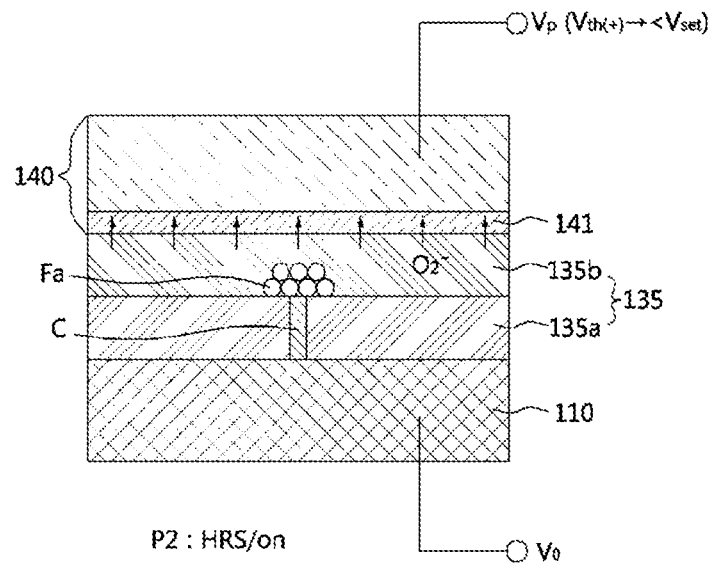

Referring to FIG. 3b and FIG. 4, a positive sweep voltage Vp ranging from a first threshold voltage $V_{th}(+)$ to less than a set voltage $V_{set}$ is applied to the second electrode 140 (P2). When the first threshold voltage $V_{th}(+)$ is applied to the second electrode 140, the threshold switching layer 135a is significantly reduced in resistance and changes into an on state. Although a conductive filament C is shown in the drawings, it is not actually generated and merely implies a change of the threshold switching layer into the on state. Then, oxygen ions in the memory switching layer 135b may be moved towards the second electrode 140 and increase the thickness of the conductive oxide region 141. At the same time, oxygen holes introduced into the memory switching layer 135b may grow an oxygen hole filament (Fa). However, the oxygen hole filament (Fa) does not grow to a height capable of contacting the second electrode 140. As a result, the memory switching layer 135b is maintained in a high resistance state (HRS) (P2 state: HRS/ON).

Figure 3C:
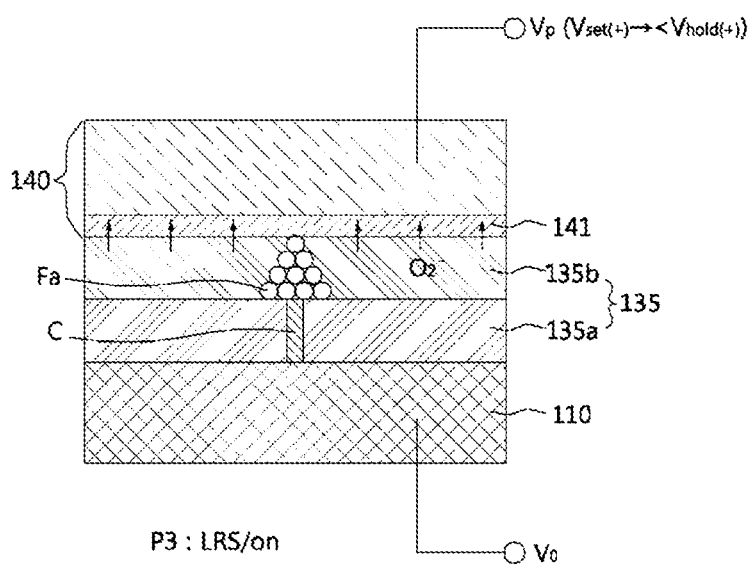

Referring to FIG. 3c and FIG. 4, a positive sweep voltage $V_p$ ranging from the set voltage $V_{set}$ to less than a first maintenance voltage $V_{hold}(+)$ is applied to the second electrode 140 (P3). In the memory switching layer 135b, oxygen holes are constantly accumulated to grow the oxygen hole filament (Fa) until the oxygen hole filament (Fa) comes into contact with the second electrode 140, thereby allowing the memory switching layer 135b to be switched into a low resistance state (LRS). The low resistance state of the memory switching layer 135b is maintained thereafter. Here, the threshold switching layer 135a is maintained in an on state (P3 state: LRS/ON).

Figure 3D:
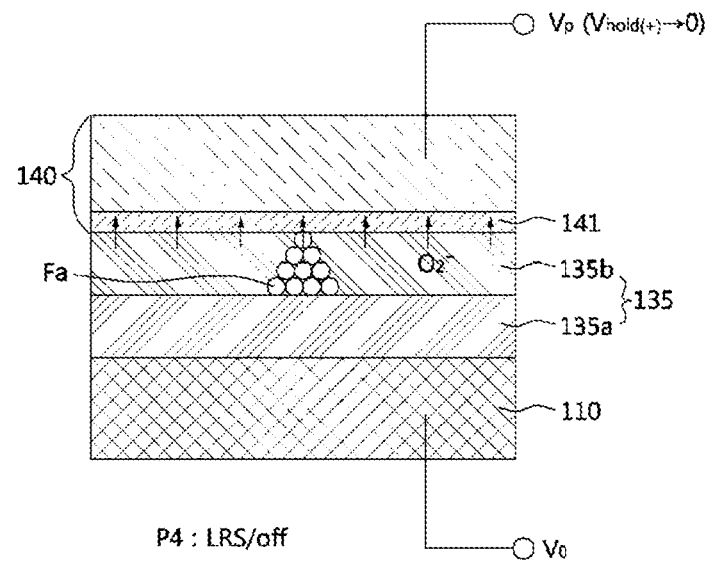

Referring to FIG. 3d and FIG. 4, a positive sweep voltage $V_p$ ranging from the first maintenance voltage $V_{hold}(+)$ to 0 V is applied to the second electrode 140 (P4). When the first maintenance voltage $V_{hold}(+)$ is applied to the second electrode 140, the threshold switching layer 135a is significantly increased in resistance and changed into an off state. In the memory switching layer 135b, oxygen holes are constantly accumulated to allow the oxygen hole filament (Fa) to contact the second electrode 140, so that the memory switching layer 135b is maintained in the low resistance state (LRS) (P4 state: LRS/OFF).

Figure 3E:
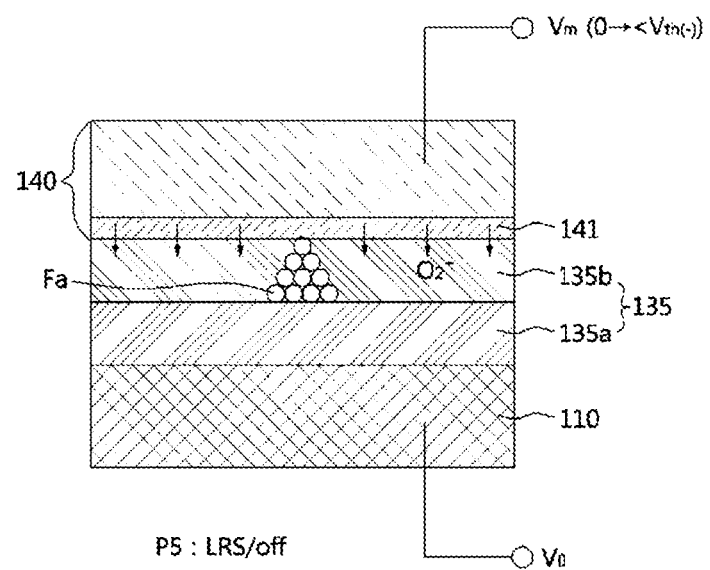

Referring to FIG. 3e and FIG. 4, a negative sweep voltage $V_m$ ranging from 0 V to less than a second threshold voltage $V_{th}(-)$ (in terms of absolute value) is applied to the second electrode 140 (P5). Then, although oxygen ions are introduced from the second electrode 140 into the memory switching layer 135b by a negative electric field generated between the first and second electrodes 110, 140, the applied negative electric field is not effective, so that the oxygen hole filament (Fa) can be maintained instead of being separated from the second electrode 140. As a result, the memory switching layer 135b is maintained in the low resistance state (LRS). On the other hand, since an effective negative electric field is not applied to the threshold switching layer 135a, the threshold switching layer is maintained in an off state (P5 state: LRS/OFF).

Figure 3F:
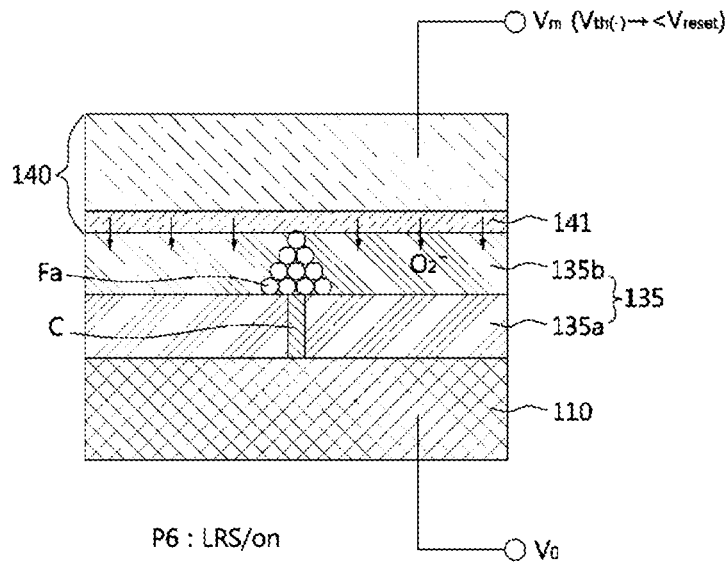

Referring to FIG. 3f and FIG. 4, a negative sweep voltage $V_m$ ranging from the second threshold voltage $V_{th}(-)$ to less than a reset voltage $V_{reset}$ (in terms of absolute value) is applied to the second electrode 140 (P6). When the second threshold voltage $V_{th}(-)$ is applied to the second electrode 140, the threshold switching layer 135a is significantly reduced in resistance and changes to an on state. Although the conductive filament C is shown in the drawings, it is not actually generated and merely implies a change of the threshold switching layer into the on state. Then, although oxygen ions are constantly introduced from the second electrode 140 into the memory switching layer 135b by a negative electric field generated between the first and second electrodes 110, 140, the applied negative electric field is not effective, so that the oxygen hole filament (Fa) can be maintained instead of being separated from the second electrode 140. As a result, the memory switching layer 135b is maintained in a low resistance state (LRS) (P6 state: LRS/ON).

Figure 3G:
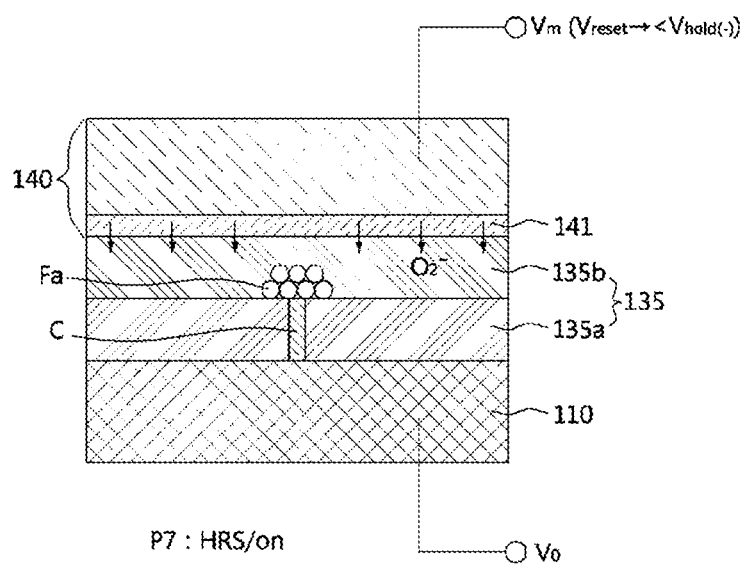

Referring to FIG. 3g and FIG. 4, a negative sweep voltage $V_m$ ranging from the reset voltage $V_{reset}$ to a second maintenance voltage $V_{hold}(-)$ (in terms of absolute value) is applied to the second electrode 140 (P7). When the reset voltage $V_{reset}$ is applied to the second electrode 140, a distal end of the oxygen hole filament in the memory switching layer 135b is completely oxidized and separated from the second electrode 140. As a result, the memory switching layer 135b is switched into a high resistance state (HRS), and is maintained in such a high resistance state (HRS). Here, the threshold switching layer 135a is maintained in an on state (P7 state: HRS/ON).

Figure 3H:
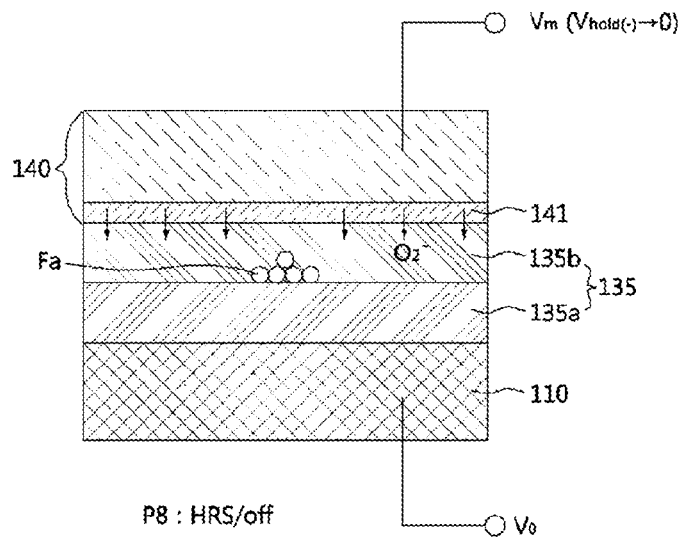

Referring to FIG. 3h and FIG. 4, a negative sweep voltage $V_m$ ranging from the second maintenance voltage $V_{hold}(-)$ to 0 V is applied to the second electrode 140 (P8). When the second maintenance voltage $V_{hold}(-)$ is applied to the second electrode 140, the threshold switching layer 135a is significantly increased in resistance and changed into an off state. In the memory switching layer 135b, oxygen holes are constantly accumulated, causing constant oxidation of the oxygen hole filament (Fa) in the memory switching layer 135b. As a result, the memory switching layer 135b is maintained in a high resistance state (HRS) (P8 state: HRS/OFF).

Figure 5:
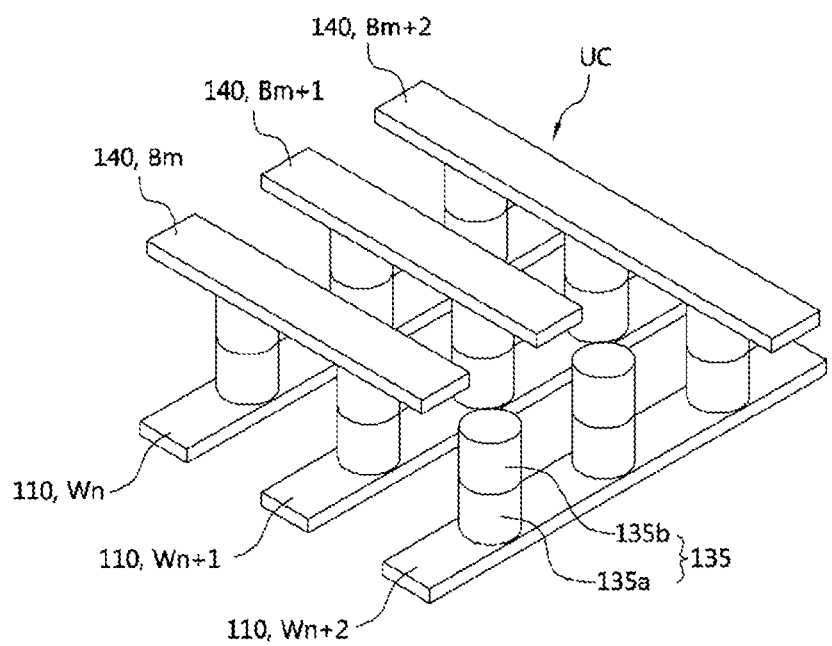
FIG. 5 is a schematic perspective view of the resistance change memory array shown in FIG. 1a to FIG. 1e and FIG. 2a to FIG. 2e.

FIG. 5 is a schematic perspective view of the resistance change memory array shown in FIG. 1a to FIG. 1e and FIG. 2a to FIG. 2e.

Referring to FIG. 5, first signal lines 110 are arranged parallel to each other in one direction on a substrate (not shown). The first signal lines 110 may be word lines $W_n$, $W_{n+1}$, $W_{n+2}$. Second signal lines 140 are arranged parallel to each other while crossing the first signal lines 110. The second signal lines 140 may be bit lines $B_m$, $B_{m+1}$, $B_{m+2}$. A threshold switching layer 135a and a memory switching layer 135b may be disposed at each of crossing points between the first signal lines 110 and the second signal lines 140 to be disposed between a pair of first and second signal lines 110, 140. The second signal lines 140 may include a conductive oxide region (not shown) in a region thereof adjoining the memory switching layer 135b. Details of the signal lines 110, 140, the threshold switching layer 135a, the memory switching layer 135b, and the conductive oxide region can be understood by referring to the descriptions given with reference to FIG. 1a to FIG. 1e and FIG. 2a to FIG. 2e.

Figure 6A:
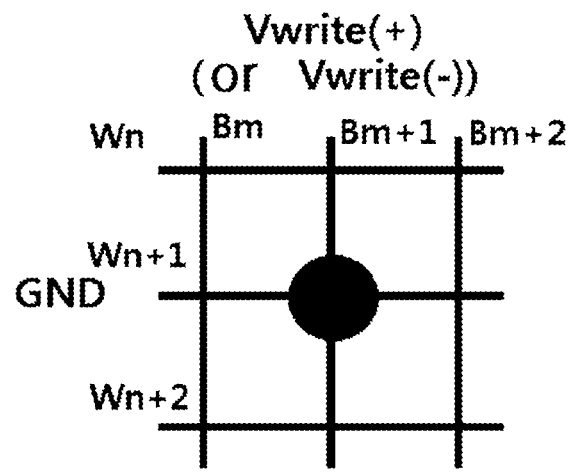
FIG. 6a is a schematic view illustrating an writing operation of a resistance change memory array in accordance with one embodiment of the present invention.

FIG. 6a is a schematic view illustrating a writing operation of a resistance change memory array in accordance with one embodiment of the present invention.

Referring to FIG. 6a, $V_{write}$ is applied to a selected bit line $B_{m+1}$ among the bit lines, and non-selected bit lines $B_m$ and $B_{m+2}$ are floated. Ground voltage is applied to a selected word line Wn+1 among the word lines, and non-selected word lines $W_n$ and $W_{n+2}$ are floated. The applied voltage $V_{write}$ has the same or greater absolute value than the set voltage $V_{set}$ (or has the same or greater absolute value than the reset voltage $V_{reset}$) described with reference to FIGS. 3a to 3h and FIG. 4.

As a result, within a selected unit cell to which $V_{write}$ is applied between the selected bit line $B_{m+1}$ and the selected word line $W_{n+1}$, the memory switching layer 135b (in FIG. 5) may be changed into the low resistance state (LRS) (or high resistance state (HRS)). However, non-selected cells, in which at least one of the bit line and word line connected thereto is floated, may be maintained in a previous state.

Figure 6B:
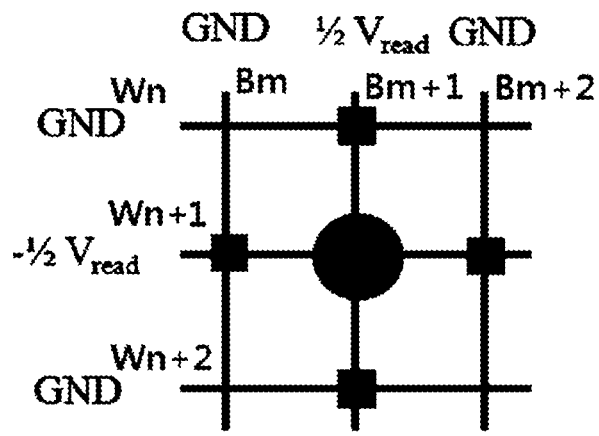
FIG. 6b is a schematic view illustrating a reading operation of the resistance change memory array in accordance with the embodiment of the present invention.

FIG. 6b is a schematic view illustrating a reading operation of the resistance change memory array in accordance with the embodiment of the present invention.

Referring to FIG. 6b, ½ $V_{read}$ is applied to a selected bit line $B_{m+1}$ among the bit lines, and ground voltage is applied to non-selected bit lines $B_m$ and $B_{m+2}$. −½ Vread is applied to a selected word line $W_{n+1}$ among the word lines, and ground voltage is applied to non-selected word lines $W_n$ and $W_{n+2}$. Here, $V_{read}$ is set to a value between the first threshold voltage $V_{th}(+)$ and the set voltage $V_{set}$ or between the second threshold voltage $V_{th}(-)$ and the reset voltage $V_{reset}$, as described with reference to FIGS. 3a to 3h and FIG. 4.

As a result, $V_{read}$ is applied to a selected cell between the selected bit line $B_{m+1}$ and the selected word line $W_{n+1}$, and ½ $V_{read}$ or 0 V is applied to non-selected cells.

Referring again to FIG. 4, if $V_{read}$ is a value between the first threshold voltage $V_{th}(+)$ and the set voltage $V_{set}$, or between the second threshold voltage $V_{th}(-)$ and the reset voltage $V_{reset}$, the threshold switching layer 135a (FIG. 5) of the selected unit cell may be turned on, thereby allowing electric current to flow in the selected unit cell according to the resistance state of the memory switching layer 135b (FIG. 5). Specifically, if data is programmed in the memory switching layer 135b (FIG. 5) in a low resistance state, electric current flowing in the selected cell to which $V_{read}$ is applied is $I_1$ (data 1). In addition, if data is programmed in the memory switching layer 135b (FIG. 5) in a high resistance state, electric current flowing in the selected cell to which $V_{read}$ is applied is $I_2$ (data 2). Here, among the non-selected cells, the cells to which ½ $V_{read}$ lower than the first or second threshold voltage $V_{th}(+)$ or $V_{th}(-)$ (in terms of absolute value) is applied may have the threshold switching layers 135a (FIG. 5) turned off, so that electric current flowing in these unit cells is $I_0$, which may be 1000 times lower than $I_1$ and 10 times lower than $I_2$. Further, among the non-selected cells, the cells to which 0 V is applied may also have the threshold switching layers 135a (FIG. 5) turned off, so that electric current flowing in these cells approaches 0 V. Here, the electric current ($I_0$ or 0) flowing in the non-selected cells is much greater than the electric current ($I_1$, $I_2$) flowing in the selected cell, thereby allowing the electric current flowing in the selected cell to be stably sensed at the distal end of the selected bit line $B_{m+1}$.

In this way, when the resistance change memory devices are arranged in a cross point array without an additional selection device, data programmed in the memory cell can be read without interference between memory cells.

Next, the present invention will be more clearly understood from the following examples. It should be understood that the following examples are provided for illustration only and are not to be construed in any way as limiting the present invention.

EXAMPLES

Preparative Example 1

Preparation of Memory Switching Device

A 50 nm thick Pt layer was formed on a substrate to provide a first electrode by RF magnetron sputtering. Next, a silicon oxide layer was formed to a thickness of about 100 nm, and holes having a diameter of about 250 nm were formed in the silicon oxide layer to expose the Pt layer therethrough. On the Pt layer exposed through the holes and the silicon oxide layer, an Nb layer was deposited to a thickness of about 10 nm by sputtering, and subjected to oxygen treatment at an oxygen partial pressure of 50 sccm and at 500° C. for 10 minutes by RTA to form a metal oxide layer. Next, an about 40 nm thick W layer was formed on the oxygen treated Nb layer to provide a second electrode by sputtering.

Preparative Example 2

Preparation of Threshold Switching Device

A 50 nm thick Pt layer was formed on a substrate to provide a first electrode by RF magnetron sputtering. Next, a silicon oxide layer was formed to a thickness of about 100 nm, and holes having a diameter of about 250 nm were formed in the silicon oxide layer to expose the Pt layer therethrough. An $NbO_{2-x}$ layer was deposited to a thickness of 10 nm on the Pt layer exposed through the holes and the silicon oxide layer by reactive sputtering at 2 sccm and at 500° C. for 10 minutes. Next, an about 40 nm thick W layer was formed on the $NbO_{2-x}$ layer to provide a second electrode by sputtering.

Preparative Example 3

Preparation of Hybrid Device

A 50 nm thick Pt layer was formed on a substrate to provide a first electrode by RF magnetron sputtering. Next, a silicon oxide layer was formed to a thickness of about 100 nm, and holes having a diameter of about 250 nm were formed in the silicon oxide layer to expose the Pt layer therethrough. An $NbO_{2-x}$ layer was deposited to a thickness of 10 nm on the Pt layer exposed through the holes and the silicon oxide layer by reactive sputtering at 2 sccm and at 500° C. for 10 minutes. Then, the $NbO_{2-x}$ is exposed to air for oxygen treatment. Next, an about 40 nm thick W layer was formed on the $NbO_{2-x}$ layer to provide a second electrode by sputtering.

Figure 7A:
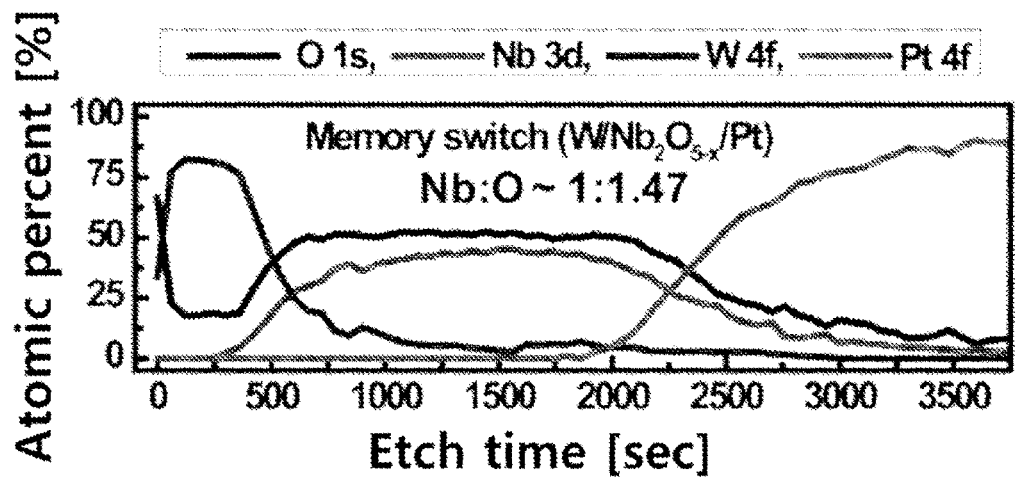
FIG. 7a is a graph depicting an analysis result of compositions of respective layers of a memory switching device of Preparative Example 1.
Figure 7B:
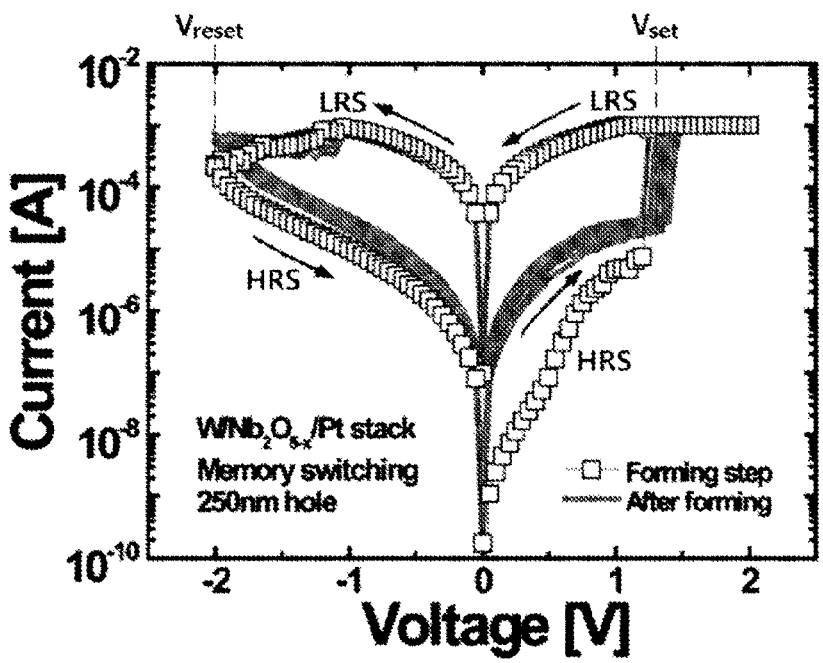
FIG. 7b is a current-voltage curve of the memory switching device of Preparative Example 1.

FIG. 7a is a graph depicting an analysis result of compositions of the respective layers of the memory switching device of Preparative Example 1, and FIG. 7b is a current-voltage curve of the memory switching device of Preparative Example 1.

Referring to FIG. 7a, the metal oxide layer of the memory switching device prepared in Preparative Example 1 has an atomic ratio of Nb to O of about 1:1.47.

Referring to FIG. 7b, the memory switching device prepared in Preparative Example 1 was set at a voltage of about 1.3 V and changed from a high resistance state (HRS) to a low resistance state (LRS), and was reset at a voltage of about −1.9 V and changed from the low resistance state (LRS) to the high resistance state (HRS).

Accordingly, it can be seen that the Nb oxide layer having an atomic ratio of Nb to O of about 1:1.47 has memory characteristics.

Figure 8A:
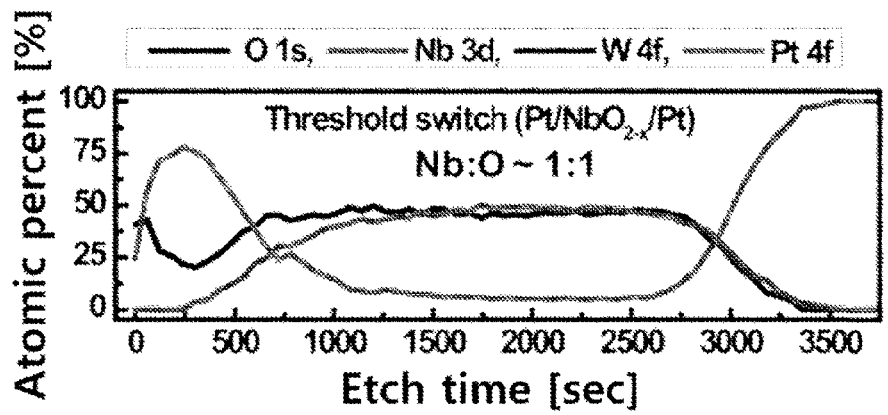
FIG. 8a is a graph depicting an analysis result of compositions of respective layers of a threshold switching device of Preparative Example 2.
Figure 8B:
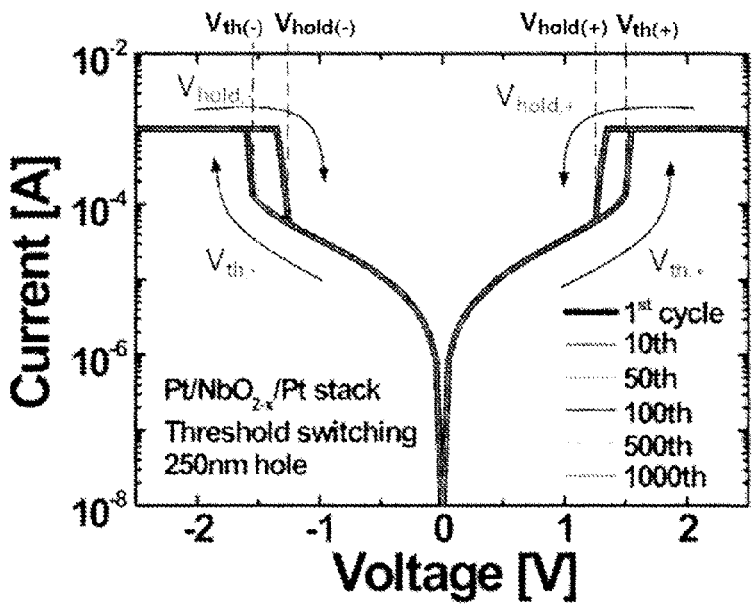
FIG. 8b is a current-voltage curve of the threshold switching device of Preparative Example 2.

FIG. 8a is a graph depicting an analysis result of compositions of the respective layers of the threshold switching device of Preparative Example 2, and FIG. 8b is a current-voltage curve of the threshold switching device of Preparative Example 2.

Referring to FIG. 8a, the metal oxide layer of the memory switching device prepared in Preparative Example 2 has an atomic ratio of Nb to O of about 1:1.

Referring to FIG. 8b, the switching device prepared in Preparative Example 2 was turned on at a first threshold voltage of about 1.55 V and turned off at a first maintenance voltage of about 1.38 V. Further, the switching device was turned on at a second threshold voltage of about −1.57 V, and turned off at a second maintenance voltage of about −1.38 V. In this way, the switching device prepared in Preparative Example 2 exhibited bipolar characteristics in which the switching device can be turned on/off in electric fields of both polarities. Accordingly, it can be seen that the Nb oxide layer having an atomic ratio of Nb to O of about 1:1 has bipolar switching characteristics.

FIG. 4 shows a current-voltage graph of the hybrid device prepared in Preparative Example 3. Referring again to FIG. 4, it can be seen that the hybrid device prepared in Preparative Example 3 provided the current-voltage curve exhibiting different characteristics than those shown in FIG. 7b or FIG. 8b, that is, both selection characteristics and memory characteristics.

Figure 8C:
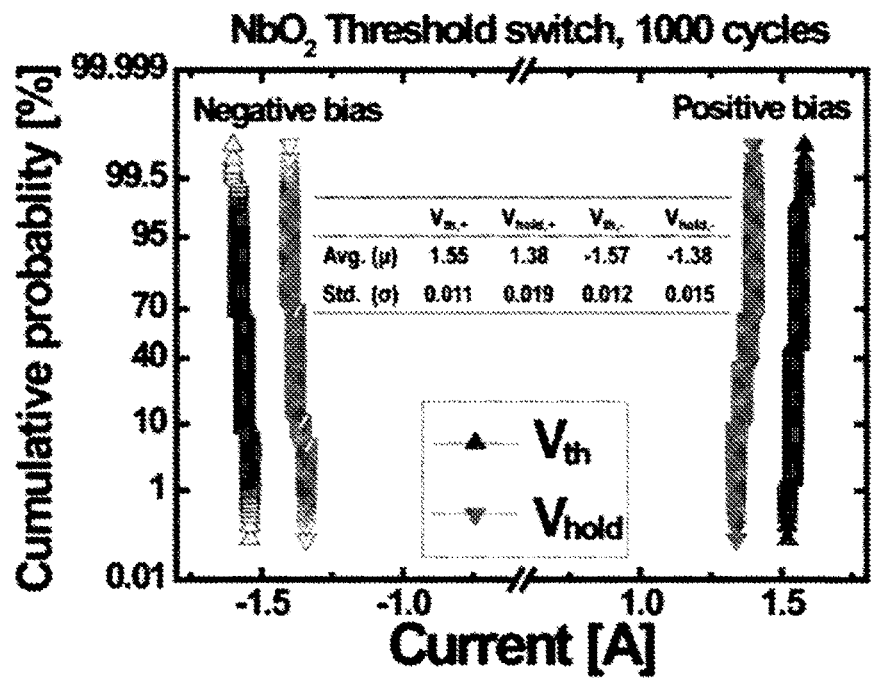
FIG. 8c is a graph depicting cumulative distribution of electric current at threshold voltage and maintenance voltage upon repeated switching of the threshold switching device of Preparative Example 2.

FIG. 8c is a graph depicting cumulative distribution of electric current at threshold voltage and maintenance voltage upon repeated switching of the threshold switching device of Preparative Example 2. The threshold voltage refers to a voltage applied to a device to turn on the device, and the maintenance voltage refers to a voltage applied to the device to turn off the device. Referring to FIG. 8c, despite repeated switching, the device had uniform distribution of electric current at threshold voltages and maintenance voltages.

Figure 8D:
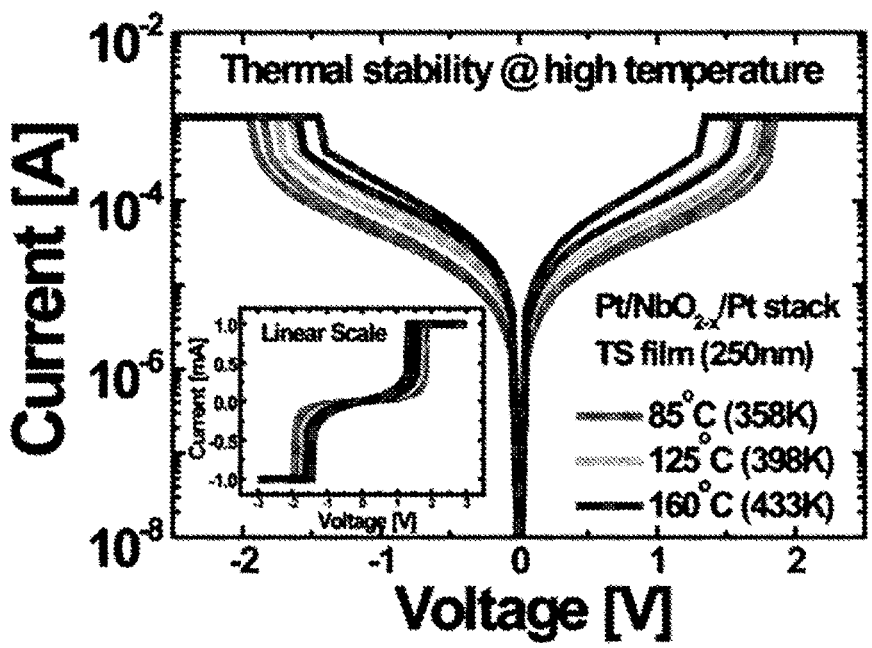
FIG. 8d is a graph depicting thermal stability of the threshold switching device of Preparative Example 2.

FIG. 8d is a graph depicting thermal stability of the threshold switching device of Preparative Example 2. Referring to FIG. 8d, it can be seen that the threshold switching device prepared in Preparative Example 2 exhibited stable threshold switching characteristics until the temperature reaches 433K (160° C.).

Figure 8E:
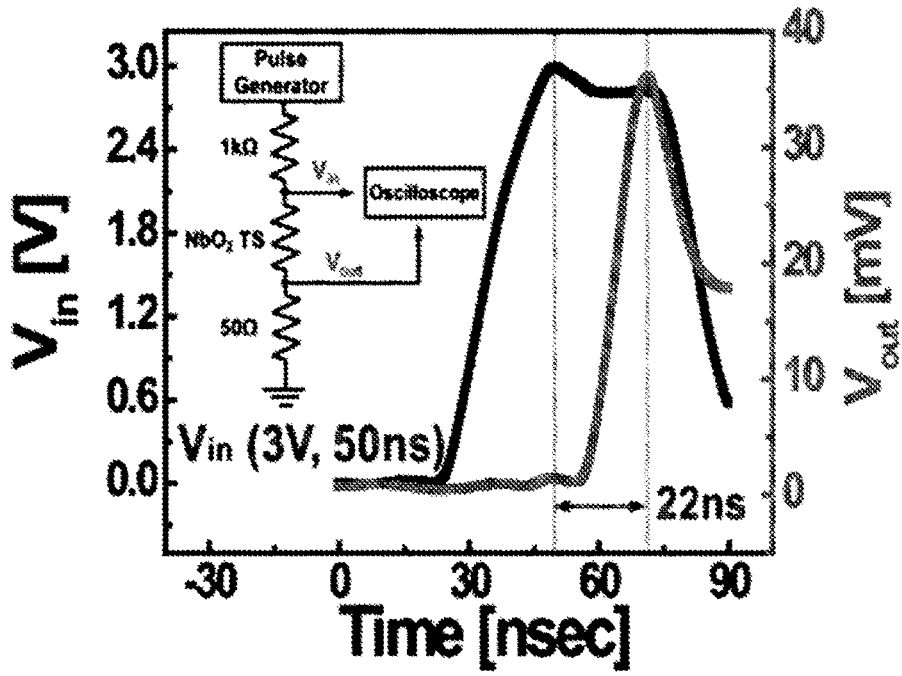
FIG. 8e is a graph depicting a switching rate of the threshold switching device of Preparative Example 2.

FIG. 8e is a graph depicting a switching rate of the threshold switching device of Preparative Example 2. Referring to FIG. 8e, the threshold switching device prepared in Preparative Example 2 exhibited a very fast switching rate of about 22 ns.

Figure 8F:
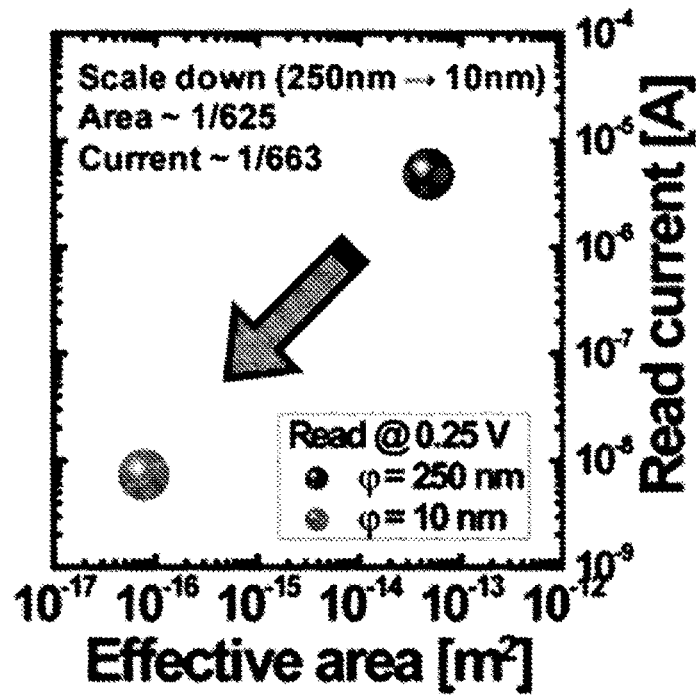
FIG. 8f is a graph depicting scale down possibility of the threshold switching device of Preparative Example 2.

FIG. 8f is a graph depicting scale-down possibility of the threshold switching device of Preparative Example 2. Referring to FIG. 8f, even in the case where the contact area with the first electrode (hole diameter in Preparative Example 2) was significantly reduced to 10 nm, the threshold switching device could exhibit a read current of about $10^{-8}$ at 0.25V, thereby providing a very high scale-down possibility.

Figure 9A:
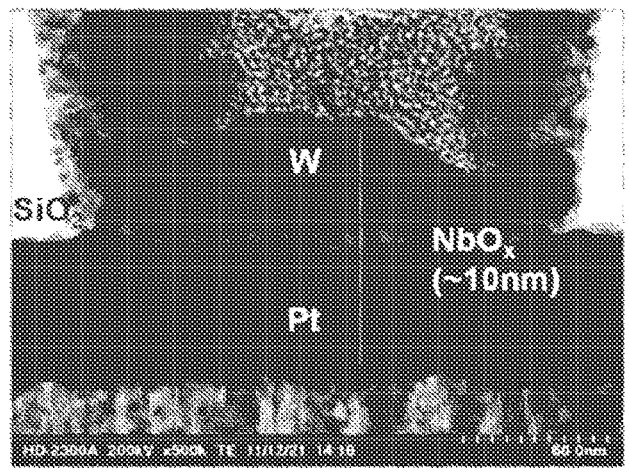
FIG. 9a is a TEM image of a cross-section of a hybrid device according to Preparative Example 3.

FIG. 9a is a TEM image of a cross-section of the hybrid device prepared in Preparative Example 3. Referring to FIG. 9a, it can be seen that an about 10 nm $NbO_x$ layer was formed as the hybrid switching layer.

Figure 9B:
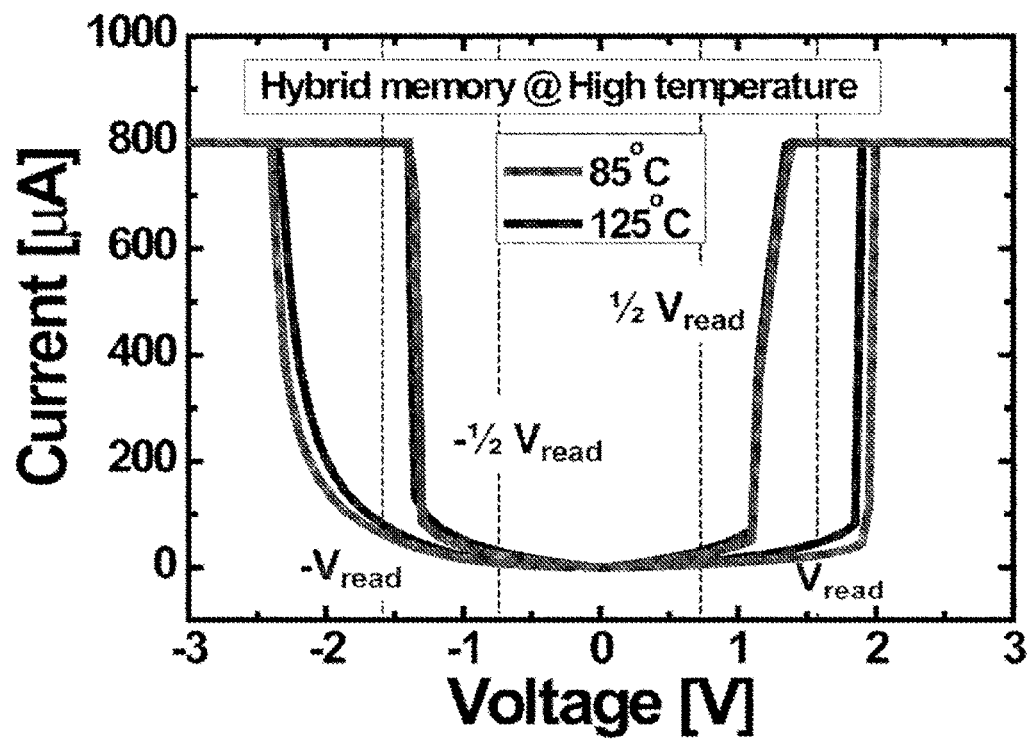
FIG. 9b is a graph depicting thermal stability of the hybrid device according to Preparative Example 3.

FIG. 9b is a graph depicting thermal stability of the hybrid device according to Preparative Example 3. Referring to FIG. 9b, it can be seen that the hybrid device had stable thermal stability until the temperature reaches 125° C.

Figure 9C:
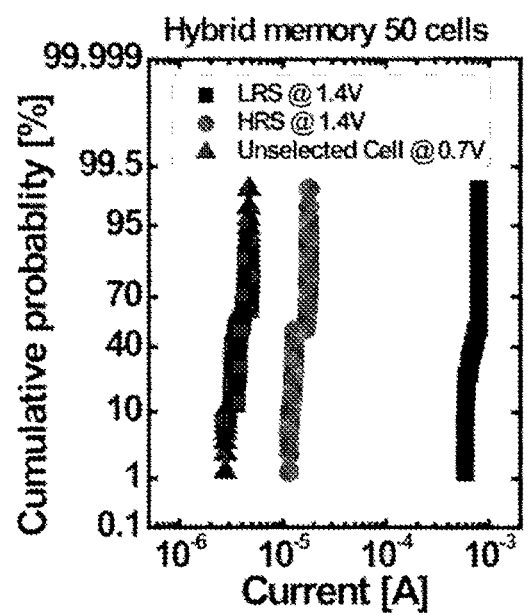
FIG. 9c is a graph depicting cumulative distribution of electric current upon repeated switching of plural hybrid devices according to Preparative Example 3.

FIG. 9c is a graph depicting cumulative distribution of electric current upon repeated switching of plural hybrid devices according to Preparative Example 3.

Referring to FIG. 9c, for the plural hybrid devices, electric current at 0.7 V corresponding to $½ V_{read}$, and high resistance state (HRS) electric current and low resistance state (LRS) electric current at 1.4 V corresponding to $V_{read}$ have uniform distribution even upon repeated switching.

As such, according to the present invention, the resistance change memory device includes a hybrid switching layer, which is a metal oxide layer having both threshold switching characteristics and memory switching characteristics, and thus can read programmed data without interference between memory cells even in a cross point array structure without a selection device.

Although some exemplary embodiments have been described herein, it should be understood by those skilled in the art that these embodiments are given by way of illustration only, and that various modifications, variations and alterations can be made without departing from the spirit and scope of the invention. The scope of the present invention should be defined by the appended claims and equivalents thereof.

What is claimed is:

1. A resistance change memory device comprising:
a first electrode;
a second electrode; and
a hybrid switching layer disposed between the first electrode and the second electrode, the hybrid switching layer being a metal oxide layer having both threshold switching characteristics and memory switching characteristics,
wherein the hybrid switching layer comprises:
a threshold switching layer disposed on the first electrode and having threshold switching characteristics; and
a memory switching layer formed by surface treatment of the threshold switching layer with oxygen and having memory switching characteristics,
wherein the memory switching layer and the threshold switching layer are formed of the same kind of metal oxide and have different oxygen content.

2. The resistance change memory device according to claim 1, wherein the hybrid switching layer is represented by $FeO_x$ ($1 \leq X \leq 2$), $VO_x$ ($1 \leq X \leq 2.5$), $TiO_x$ ($1 \leq X \leq 2$), or $NbO_x$ ($1 \leq X \leq 2.5$).

3. The resistance change memory device according to claim 1, wherein the memory switching layer having a higher oxygen content than the threshold switching layer.

4. The resistance change memory device according to claim 3, wherein the threshold switching layer exhibits metal-insulator transition characteristics.

5. The resistance change memory device according to claim 3, wherein the threshold switching layer is represented by $FeO_x$ ($1 \leq X \leq 1.5$), $VO_x$ ($1 \leq X \leq 2$), $TiO_x$ ($1 \leq X \leq 1.75$), or $NbO_x$ ($1 \leq X \leq 2$).

6. The resistance change memory device according to claim 3, wherein the threshold switching layer is represented by $NbO_x$ ($1 \leq X \leq 2$).

7. The resistance change memory device according to claim 1, wherein the second electrode contains a metal having the same or lower Gibb's free energy for generation of oxides than a metal contained in the hybrid switching layer, at least in a region thereof adjoining the hybrid switching layer, so that oxygen in the hybrid switching layer moves into the second electrode, the region is changed into a metal-rich conductive oxide region, and oxygen holes are accumulated inside the hybrid switching layer.

8. A method of fabricating a resistance change memory, comprising:
forming a first electrode;
forming a metal-rich non-stoichiometric metal oxide layer on the first electrode;
subjecting the metal oxide layer to surface treatment with oxygen to form a hybrid switching layer corresponding to a metal oxide layer having both threshold switching characteristics and memory switching characteristics; and
forming a second electrode on the hybrid switching layer,
wherein the hybrid switching layer comprises:
a threshold switching layer disposed on the first electrode and having threshold switching characteristics; and
a memory switching layer disposed on the threshold switching layer and having memory switching characteristics,
wherein the memory switching layer and the threshold switching layer are formed of the same kind of metal oxide and have different oxygen content.

9. The method of fabricating a resistance change memory device according to claim 8, wherein the metal-rich non-stoichiometric metal oxide layer exhibits metal-insulator transition characteristics.

10. The method of fabricating a resistance change memory device according to claim 8, wherein the metal-rich non-stoichiometric metal oxide layer is represented by $FeO_x$ ($1 \leq X \leq 1.5$), $VO_x$ ($1 \leq X \leq 2$), $TiO_x$ ($1 \leq X \leq 1.75$), or $NbO_x$ ($1 \leq X \leq 2$).

11. The method of fabricating a resistance change memory device according to claim 8, wherein the memory switching layer having a higher oxygen content than the threshold switching layer.

12. The method of fabricating a resistance change memory device according to claim 8, wherein oxygen in the hybrid switching layer moves into the second electrode, so that the region is changed into a conductive oxide region.

13. The method of fabricating a resistance change memory device according to claim 8, wherein the second electrode contains a metal having the same or lower Gibb's free energy for generation of oxides than a metal contained in the hybrid switching layer, at least in a region thereof adjoining the hybrid switching layer, so that oxygen in the hybrid switching layer moves into the second electrode, the region is changed into a metal-rich conductive oxide region, and oxygen holes are accumulated inside the hybrid switching layer.

14. A resistance change memory array comprising:
a plurality of first signal lines;
a plurality of second signal lines crossing the first signal lines; and
a hybrid switching layer disposed at each of crossing points between the first signal lines and the second signal lines, the hybrid switching layer being an oxide layer having both threshold switching characteristics and memory switching characteristics,
wherein the hybrid switching layer comprises:
a threshold switching layer disposed on the first signal lines and having threshold switching characteristics; and
a memory switching layer formed by surface treatment of the threshold switching layer with oxygen and having memory switching characteristics,
wherein the memory switching layer and the threshold switching layer are formed of the same kind of metal oxide and have different oxygen content.

15. The resistance change memory array according to claim 14, wherein the hybrid switching layer is represented by $FeO_x$ ($1 \leq x \leq 2$), $VO_x$ ($1 \leq X \leq 2.5$), $TiO_x$ ($1 \leq X \leq 2$), or $NbO_x$ ($1 \leq X \leq 2.5$).

16. The resistance change memory array according to claim 14, wherein the memory switching layer having a higher oxygen content than the threshold switching layer.

17. The resistance change memory array according to claim 16, wherein the threshold switching layer exhibits metal-insulator transition characteristics.

18. The resistance change memory array according to claim 16, wherein the threshold switching layer is represented by $FeO_x$ ($1 \leq X \leq 1.5$), $VO_x$ ($1 \leq X \leq 2$), $TiO_x$ ($1 \leq X \leq 1.75$), or $NbO_x$ ($1 \leq X \leq 2$).

19. The resistance change memory device according to claim 16, wherein the threshold switching layer is represented by $NbO_x$ ($1 \leq X \leq 2$).

20. The resistance change memory array according to claim 14, wherein the second signal lines contains a metal having the same or lower Gibb's free energy for generation of oxides than a metal contained in the hybrid switching layer, at least in a region thereof adjoining the hybrid switching layer, so that oxygen in the hybrid switching layer moves into the second signal lines, the region is changed into a metal-rich conductive oxide region, and oxygen holes are accumulated inside the hybrid switching layer.

* * * * *